(12) United States Patent
Li et al.

(10) Patent No.: US 8,390,193 B2
(45) Date of Patent: Mar. 5, 2013

(54) LIGHT EMITTING DEVICE WITH PHOSPHOR WAVELENGTH CONVERSION

(75) Inventors: Yi-Qun Li, Danville, CA (US); Haitao Yang, San Jose, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 12/639,688

(22) Filed: Dec. 16, 2009

(65) Prior Publication Data

US 2010/0164346 A1 Jul. 1, 2010

Related U.S. Application Data

(60) Provisional application No. 61/141,948, filed on Dec. 31, 2008.

(51) Int. Cl.
*H01J 1/62* (2006.01)

(52) U.S. Cl. ......... 313/512; 313/506

(58) Field of Classification Search ........... 313/498–512
See application file for complete search history.

(56) References Cited

U.S. PATENT DOCUMENTS

| | | | |
|---|---|---|---|
| 5,998,925 | A | 12/1999 | Shimizu |
| 7,311,858 | B2 | 12/2007 | Wang |
| 7,390,437 | B2 | 6/2008 | Dong |
| 7,575,697 | B2 | 8/2009 | Li |
| 7,601,276 | B2 | 10/2009 | Li |
| 2004/0227149 | A1 * | 11/2004 | Ibbetson et al. .............. 257/100 |
| 2005/0152146 | A1 | 7/2005 | Owen et al. |
| 2006/0060867 | A1 | 3/2006 | Suehiro |
| 2006/0158090 | A1 | 7/2006 | Wang et al. |
| 2007/0029526 | A1 | 2/2007 | Cheng et al. |
| 2007/0114562 | A1 | 5/2007 | Radkov et al. |
| 2007/0195532 | A1 | 8/2007 | Reisenauer et al. |
| 2007/0279903 | A1 | 12/2007 | Negley et al. |
| 2008/0111472 | A1 | 5/2008 | Liu et al. |
| 2009/0294780 | A1 | 12/2009 | Chou et al. |

OTHER PUBLICATIONS

International Search Report and Written Opinion dated Mar. 1, 2010 for International Application No. PCT/US2009/069477.

* cited by examiner

*Primary Examiner* — Bumsuk Won
(74) *Attorney, Agent, or Firm* — Vista IP Law Group, LLP

(57) ABSTRACT

A light emitting device comprises: a thermally conductive substrate (MCPCB); at least one LED mounted in thermal communication with a surface of the substrate; a housing attached to the substrate and configured such the housing and substrate together define a volume that totally encloses the at least one LED, the housing comprising at least a part that is light transmissive (window); and at least one phosphor material provided on an inner surface of the housing within said volume said phosphor being operable to absorb at least a part of the excitation light emitted by the at least one light emitting diode and to emit light of a second wavelength range. The housing is attached to the substrate such that the volume is substantially water tight, preferably air/gas tight.

18 Claims, 8 Drawing Sheets

LIGHT EMITTING DEVICE WITH PHOSPHOR WAVELENGTH CONVERSION

CROSS-REFERENCE TO RELATED APPLICATIONS

This application claims the benefit of priority to U.S. Provisional Application 61/141,948, filed Dec. 31, 2008, by Yi-Qun Li et al. entitled "Light emitting device with phosphor wavelength conversion", the specification and drawings of which are incorporated herein by reference.

BACKGROUND OF THE INVENTION

1. Field of the Invention

This invention relates to light emitting devices with phosphor wavelength conversion and in particular, although not exclusively, to white light generating devices based on one or more light emitting diodes (LEDs). Moreover embodiments of the invention concern packaging arrangements for high emission intensity (i.e. $\geqq 50$ lumens light emission intensity or $\geqq 1$ W input power) white light emitting devices for general lighting applications.

2. Description of the Related Art

White light emitting LEDs ("white LEDs") are a relatively recent innovation and offer the potential for a whole new generation of energy efficient lighting systems to come into existence. It is predicted that white LEDs could replace filament (incandescent), fluorescent and compact fluorescent light sources due to their long operating lifetimes, potentially many 100,000 of hours, and their high efficiency in terms of low power consumption. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light or yellow and red light. The portion of the blue light generated by the LED that is not absorbed by the phosphor combined with the light emitted by the phosphor provides light which appears to the human eye as being nearly white in color.

An example of a light emitting device based on LEDs that can be operated from a high voltage (110/220V) alternating current (AC) supply is described in co-pending U.S. patent application Publication No. US 2009/0294780 published Dec. 3, 2009 and is shown schematically in FIG. 1. Referring to FIG. 1 the device 10 comprises a ceramic package 12, such as a low temperature co-fired ceramic (LTCC), having an array of nine circular recesses (cavities) 14 (FIG. 1 shows an array of nine recesses arranged in a square array 3 rows by 3 columns) in which each recess 14 is configured to house a respective LED chip 16, typically a blue emitting gallium nitride-based LED chip. The walls of the recesses 14 are inclined and can include a reflective surface 17 such as a metallization layer of silver or aluminum such that each recess 14 comprises a reflector cup for increasing emission of light from the device. The package 12 is a multi-layered structure and incorporates a pattern of electrically conducting tracks 18 configured to interconnect the LED chips 16 in a desired configuration (e.g. a serially connected string or a bridge configuration for a self-rectifying arrangement). The conducting tracks 18 are configured such that a part of them extends into the recess to provide a pair of electrode pads 20 on the floor of the recess 14 for electrical connection to a respective LED chip 16. On a lower face of the package 12 one or more solder pads 22 are provided for electrically connecting the device 10 to an AC power source. The solder pads 22 are connected to the conducting tracks 18 by conducting vias 24. Each LED chip 16 is mounted in thermal communication with the floor of the recess using a thermally conducting adhesive such as a silver loaded epoxy or by soldering. Electrodes 26, 28 on the LED chip 16 are connected by a bond wire 30, 32 to a respective electrode pad 20 on the floor of the recess. Each recess 14 is completely filled (potted) with a transparent polymer material 34 such as silicone which is loaded with the powdered phosphor material(s).

A problem with existing light emitting devices, in particular white light emitting devices intended for general lighting which require a high intensity output of ≈500-600 lumens or higher (i.e. an input power of about 6.5 to 8 W), is thermal degradation of the phosphor material with time which can result in a significant change in the correlated color temperature (CCT) and/or intensity of light emitted by the device. The inventors have further appreciated that absorption of water by the phosphor material(s) during operation of the device can also significantly affect the performance of the phosphor material(s) and hence the device. The effect of water absorption on photo luminescence varies between phosphor compositions and can be more pronounced for silicate-based phosphor materials which are able to more readily form water soluble compounds. Initial tests suggest that the absorption of water can occur even when the phosphor material is encapsulated in a polymer binder, such as a silicone, and a reduction in light emission of ≈10% may occur for a device with an ortho-silicate phosphor that is operated in a humid environment (i.e. $\geqq 80\%$ relative humidity) at a temperature of 25° C. for more than 200 hours. As well as phosphor degradation, other packaging materials can be affected by the presence of water such as for example the transparency of the encapsulating polymer materials, the reflectivity of reflective surfaces and the performance of the LED chip.

SUMMARY OF THE INVENTION

The present embodiments arose in an endeavor to provide a light emitting device which at least in part overcomes the limitations of the known arrangements and in particular, although not exclusively, reduce phosphor degradation in devices with an output emission intensity of $\geqq 50$ lumens (i.e. $\geqq 1$ W input power). More particularly the invention seeks to eliminate, or at least reduce, water absorption in light emitting devices that utilize silicate-based phosphor materials.

Embodiments of the invention are directed to a light emitting device in which one or more light emitting diodes (LEDs) and phosphor material(s) are housed within a water tight, preferably air/gas tight, housing. Preferably the one or more phosphor materials are provided on an inner surface of the housing that is remote to the LEDs, typically by a minimum distance of ≈0.2 mm to 1 mm. Incorporating the LED(s) and phosphor material(s) inside a water/gas tight (hermetically sealed) housing prevents degradation of the phosphor material(s) by the uptake of water from the environment. Moreover, when the phosphor material(s) is/are provided remote to the LEDs, rather than in thermal contact with the LEDs, this can reduce thermal degradation of the phosphor material.

According to the invention there is provided a light emitting device comprising: a thermally conductive substrate; at least one light emitting diode (LED) mounted in thermal communication with a surface of the substrate and operable to emit excitation light having a dominant wavelength in a first wavelength range; a housing attached to the substrate and configured such that the housing and substrate together define a volume that totally encloses the at least one light emitting diode, the housing comprising at least a part that is light transmissive; and at least one phosphor material provided on an inner surface of the housing within said volume, said phosphor material being operable to absorb at least a part of the excitation light and to emit light having a dominant wavelength in a second wavelength range and wherein the housing is attached to the substrate such that the volume is substantially water tight. In this patent specification, "water tight" means capable of preventing the passage of water or water vapor. Advantageously, the housing is attached to the substrate such that the volume is substantially air/gas tight.

To achieve a desired emission intensity the device can comprise a plurality of LEDs mounted in thermal communication with the surface of the substrate and the housing is configured such the housing and substrate together define a volume that totally encloses the plurality of LEDs. The device of the invention finds particular application in general lighting where the emission product will typically be light which appears white in color and is composed of light of the first and second wavelength ranges. For general lighting applications the device has an emission product of intensity of at least 50 lumens, preferably at least 100 lumens, more preferably at least 250 lumens and even more preferably at least 500 lumens. Accordingly for existing LEDs, such as those based on gallium nitride (GaN), the at least one LED or the plurality of LEDs has/have an input power of one watt or higher and preferably an input power of the order of ten watts and higher.

In one arrangement the volume can at least partially be filled with a light transmissive (transparent) thermally conductive material such as a gel, a mineral oil or a thermally conductive polymer. Such a material can aid in the dissipation of heat generated by the LEDs. Preferably, the light transmissive material has a refractive index that is as close to the refractive index of the LEDs and phosphor material(s) as possible to increase emission of light from the LEDs by providing a degree of refractive index matching. In practice the refractive index of the light transmissive material is $\geq 1.2$.

Alternatively, when the housing is gas tight, the volume can be filled with a dry gas such as nitrogen, neon, argon, krypton or xenon. Such an arrangement ensures that the phosphor material(s) is/are maintained within a dry inert atmosphere thereby reducing the likelihood of oxidation and/or reduction of the phosphor material(s) and/or other packaging materials.

The housing can be attached to the substrate to form a water/gas tight seal by soldering using a gold/germanium (Au/Ge), gold/tin (Au/Sn) or other tin alloys; brazing using copper, copper/tungsten (Cu/W) or iron-nickel (Fe/Ni) alloys; or using an adhesive such as a metal loaded epoxy.

In one arrangement the part of the housing that is light transmissive comprises an opening in the housing that is covered by a window attached to the housing. The window is attached to the housing such as to form a water tight, preferably air/gas tight, seal by for example soldering, a compression seal or using an adhesive such as a metal loaded epoxy. Typically the window comprises a glass such as a silica glass, quartz glass or a light transmissive inorganic material such as transparent alumina ($Al_2O_3$). It is envisaged that the window can comprise a polymer material such as a polycarbonate or an acrylic where it is required that the housing is water tight as opposed to air/gas tight.

Alternatively, the housing can comprise a material that is light transmissive such as silica glass, quartz glass or a light transmissive inorganic material such as transparent alumina ($Al_2O_3$). Where the device is water tight the housing material can comprise a polymer material such as a polycarbonate or an acrylic. A housing fabricated from a light transmissive material provides the benefit of minimizing the number of water/gas tight seals. In one arrangement the housing comprises a substantially hemispherical shell.

To aid in the dissipation of heat the housing can comprise a thermally conductive material such as a metal that preferably has a low coefficient of thermal expansion such as an Invar® nickel iron alloy. Alternatively, the housing can comprise other metals and/or alloys such as aluminum or copper or a thermally conductive polymer or a thermally conductive ceramic. In one arrangement the housing comprises a substantially parabolic reflector.

In general the phosphor material(s) is/are provided on the part of the housing that is light transmissive, for example the window, in the form of a substantially uniform thickness layer by spin-coating, doctor blading, tape-casting, spraying, inkjet printing or by other deposition techniques. For devices where the excitation light contributes to the final emission product—whether the final emission product is white or another color—and to increase the emission intensity, the layer of phosphor material(s) can include at least one area (region) with no phosphor material(s). The region(s) without phosphor material act as a window allowing the emission of both the excitation light and the photoluminescence generated light of the second wavelength range. In order to achieve a uniform emission color and/or color temperature over the entire light emitting surface area (i.e. light transmissive part of the housing) of the device the phosphor material(s) layer comprises a plurality of regions with no phosphor material that are substantially uniformly distributed over the light emitting surface in the form of a regular pattern or array. The pattern of phosphor material is conveniently deposited on the housing by screen printing a mixture of the one or more phosphor materials and a suitable binder, such as NAZDAR's clear screen ink 9700. Alternatively, the pattern of phosphor material can be produced by other deposition methods such as ink jet printing, offset or gravure printing.

The substrate can comprise any thermally conducting material such as a printed circuit board (PCB), a metal core printed circuit board (MCPCB), a ceramic circuit board or a thermally conducting ceramic such as a low temperature co-fired ceramic (LTCC) or alumina.

According to a another aspect of the invention there is provided a white light emitting device comprising: a thermally conductive substrate; a plurality of light emitting diode mounted in thermal communication with a surface of the substrate and operable to emit light having a dominant wavelength in a first wavelength range; a housing attached to the substrate and configured such that the housing and substrate together define a volume that totally encloses the plurality of light emitting diodes, the housing comprising at least a part that is light transmissive; and at least one phosphor material provided on an inner surface of the housing within said volume, said phosphor being operable to absorb at least a part of the excitation light and to emit light of a second wavelength range, wherein the emission product of the device comprises light of the first and second wavelength ranges and appears white in color; and wherein the housing is attached to the substrate such that the volume is at least water tight and wherein the emission product intensity of the device is at least 50 lumens.

Whilst it is preferred for the phosphor material(s) to be provided remotely to (i.e. physically separated from) the LED(s) it is envisaged that it can be beneficial to house LEDs that incorporate phosphor material(s) (i.e. those in which the phosphor is provided on the surface of the LED chip) within a water tight/gas tight enclosure. According to a yet further aspect of the invention there is provided a light emitting device comprising: a thermally conductive substrate; at least one light emitting diode incorporating a phosphor material mounted in thermal communication with a surface of the substrate; and a housing attached to the substrate and configured such that the housing and substrate together define a volume that totally encloses the at least one light emitting diode, the housing comprising at least a part that is light transmissive; and wherein the housing is attached to the substrate such that the volume is at least water tight.

BRIEF DESCRIPTION OF THE DRAWINGS

In order that the present invention is better understood light emitting devices according to embodiments of the invention will now be described, by way of example only, with reference to the accompanying drawings in which.

DETAILED DESCRIPTION OF THE INVENTION

Figure 1:
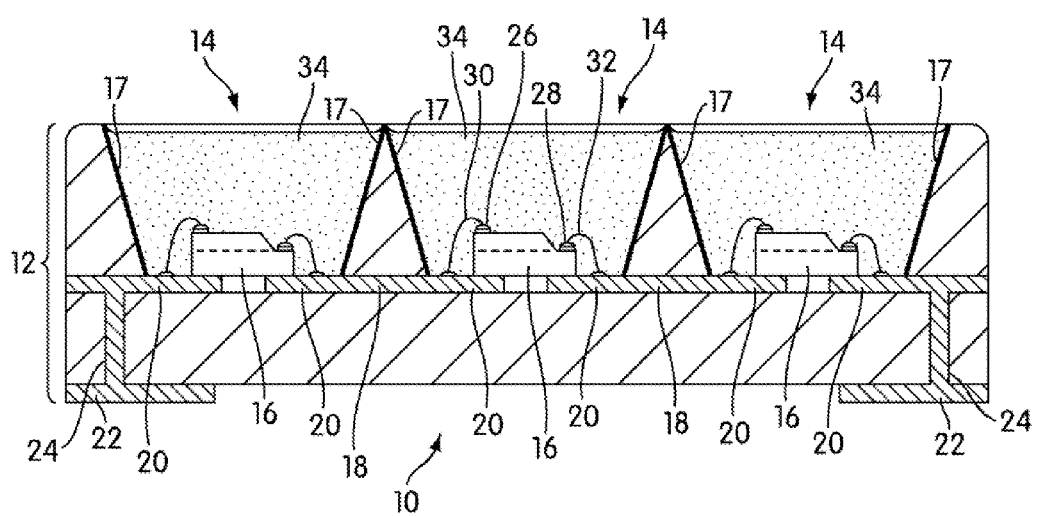
FIG. 1 is a schematic sectional representation of a known high power AC white light emitting device with phosphor wavelength conversion as previously described.

Throughout this specification like reference numerals are used to denote like parts.

A light emitting device 50 in accordance with a first embodiment of the invention will now be described with reference to FIGS. 2 and 3 of the accompanying drawings. The device 50 is configured to generate white light with a specific correlated color temperature (CCT) for example 2700K and an emission intensity of $\geqq$250 lumens (i.e. $\geqq$3 W input power) preferably $\geqq$500-600 lumens (i.e. $\geqq$6 W input power). The device is intended for general lighting applications such as a replacement for an incandescent, fluorescent or cold cathode fluorescent light source. It will be appreciated that the device of the present invention is not limited to such applications, emission colors or emission intensities.

Figure 2:
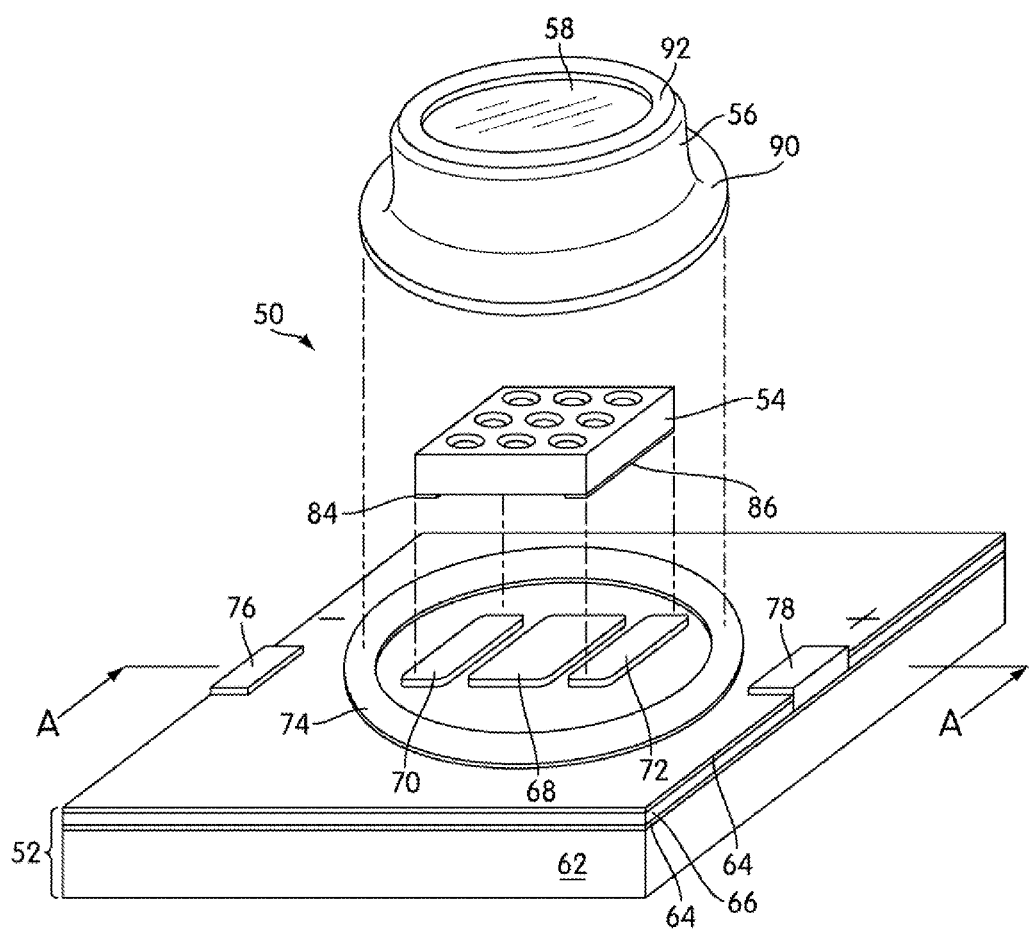
FIG. 2 is a partially exploded schematic perspective representation of a light emitting device in accordance with a first embodiment of the invention.
Figure 3:
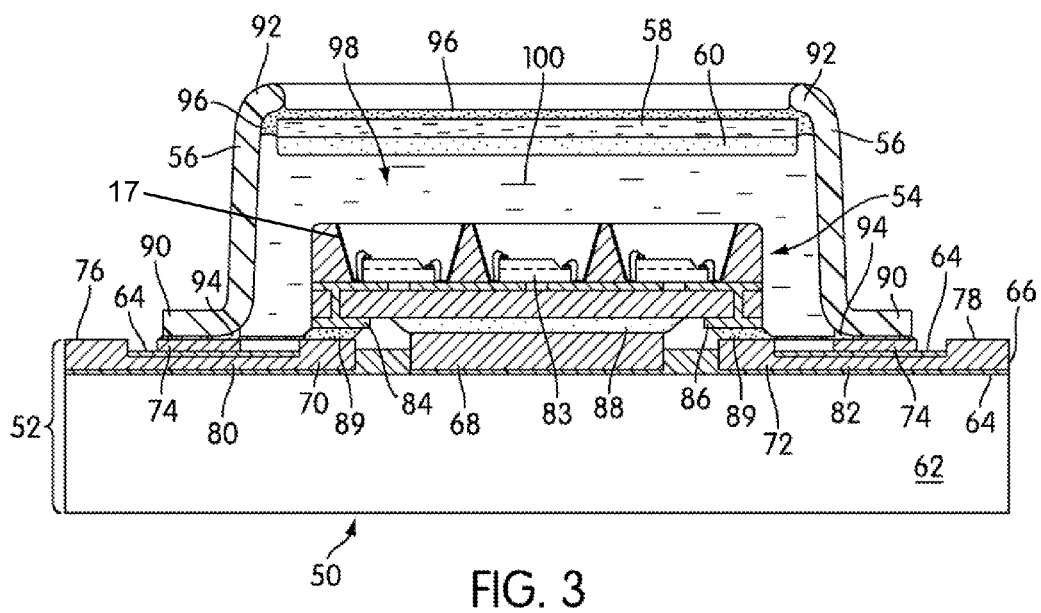
FIG. 3 is a schematic sectional representation of the light emitting device of FIG. 2 through a line "A-A"

Referring to FIGS. 2 and 3 the device 50 comprises a thermally conducting substrate 52 such as for example a metal core printed circuit board (MCPCB); a packaged LED array 54; a hollow metal housing (can) 56; a light transmissive (transparent) window 58 and a layer of one or more phosphor materials 60 on the window 58. As is known MCPCBs are commonly used for mounting electrical components that generate large amounts of heat (i.e. $\geqq$5 W) and have a layered structure comprising a thermally conducting base 62, typically a metal such as aluminum (Al), and alternating layers of an electrically non-conducting/thermally conducting dielectric material 64 and electrically conducting tracks 66, typically made of copper (Cu). The dielectric layers 64 are very thin such that they can conduct heat from components mounted on the electrical tracks to the base 62. The electrically conducting tracks 66 are configured to define an electrical circuit for providing electrical power to the LED array 54. As is best seen in FIG. 2, the conducting tracks 66 define, on an upper surface of the MCPCB (i.e. the face opposite to the aluminum base 62), a thermally conducting mounting pad 68 for mounting the LED array 54; two contact pads 70, 72 disposed along opposite edges of the mounting pad 68 for electrical connection to the LED array 54; an annular mounting pad 74 for mounting the housing 56 that encircles the mounting pad 68 and contact pads 70, 72 and a pair of electrode contact pads 76, 78 located outside of the annular mounting pad 68 for connecting the device 50 to an electrical power source. The electrode contact pads 76, 78 are electrically connected to a respective one of the contact pads 70, 72 by a respective buried conducting track 80, 82 that passes underneath the annular mounting pad 74 (FIG. 3).

In the exemplary embodiment in FIGS. 2 and 3, the packaged LED array 54 comprises an array of blue emitting InGaN/GaN (indium gallium nitride/gallium nitride) based LED chips 83 packaged in a ceramic package (see FIG. 1) of a type for example as described in co-pending U.S. patent application Publication No. US 2009/0294780 published Dec. 3, 2009 the specification and drawings of which are incorporated herein by reference. The ceramic package can be a low temperature co-fired ceramic (LTCC) with an array of circular recesses (cavities) in which each recess is configured to house a respective LED chip 83. The walls of the recesses are inclined and can include a light reflective surface 17 such as a metallization layer of silver or aluminum such that each recesses comprises a reflector cup for increasing emission of light from the device. It is to be noted that the LED array 54 does not incorporate a phosphor material within the recesses. For the purposes of illustration only the LED array 54 is shown as comprising a square array of nine LED chips 83, though in practice it will typically comprise many more LED chips to achieve a desired emission intensity. For example for 110V operation the device 50 can include one or more arrays 54 each containing forty five series connected 65 mW LED chips 83 such that each array has an input power of $\approx$2.9 W and light intensity output of $\approx$220 lumens. Each LED chip 83 is operable to generate light having a dominant wavelength $\lambda_1$ in a first wavelength range (e.g. blue $\approx$400 nm to 480 nm) that provides excitation energy (radiation) for exciting the phosphor material 60 and in view of this function the light generated by the LED array 54 will hereinafter be referred to as excitation light (radiation). The LED array 54 is a surface mount package and has a pair of electrode pads 84, 86 extending along opposite edges of its base. The LED array 54 is mounted in thermal communication with the thermal mounting pad 68 with the aid of a thermally conducting material 88, such as heat sink compound, and the electrode pads 84, 86 are electrically connected to a corresponding one of the electrode pads 70, 72 by for example soldering 89.

The metal housing (can) 56 is configured such that it totally surrounds and encloses the packaged LED array 54 when it is mounted on the MCPCB 52. As illustrated the housing 56 is generally cylindrical in shape and has at one end an outwardly (radially) extending flange (lip) 90 that defines an annular foot for attaching the housing 56 to the annular mounting pad 74 and has at the opposite end an inwardly extending lip (flange) 92 for attaching the window 58. The housing 56 is preferably made of a metal with a high thermal conductivity and a low thermal expansion such as for example an Invar® nickel iron alloy. In alternative embodiments it can comprise copper (Cu) or a copper alloy. The shape and size of the annular mounting pad 74 is configured to correspond to the footprint of the annular flange 90 and the housing 56 is attached to the MCPCB 52 by soldering 94 the flange 90 to mounting pad 74 with a gold/germanium (Au/Ge), gold/tin (Au/Sn) or other tin alloy solder. As will be further described the solder joint 94 forms a water tight, preferably air/gas tight, seal (hermetic seal) between the housing 56 and MCPCB 52 and prevents the ingress of water into the device. In the context of this patent specification a "hermetic" seal means a seal that is substantially water or gas tight.

The window 58 comprises a water/gas proof material that is substantially transmissive (transparent) to light generated by the LED chips 83 and photo-luminescent light generated by the phosphor material(s) 60. Typically it can comprise a glass such as a silica glass or quartz glass or a light transmissive inorganic material such as transparent alumina ($Al_2O_3$). As illustrated the window 58 can comprise a circular planar disc that is configured to fit inside the housing 56. The window 58 is attached to the inner surface of the lip 92 by a seal 96, such as a solder joint, that forms a water tight, preferably air/gas tight, hermetic, seal between the housing 56 and the window 58 and prevents the ingress of water into the device. The seal 96 can comprise a solder joint such as for example a gold/germanium (Au/Ge), gold/tin (Au/Sn) or other tin alloy, a brazed joint using for example copper, copper/tungsten (Cu/W) or iron-nickel (Fe/Ni) alloys or an adhesive joint such as a metal loaded epoxy or silicone material. The window can include a metallization layer for facilitating the joint with the metal housing. It will be appreciated that the MCPCB 52, housing 56 and window 58 together define a water (moisture) tight, preferably air/gas tight, volume (enclosure or cavity) 98 that totally encloses the LED array 54 and the phosphor material 60.

The phosphor material 60, which is typically in powder form, is thoroughly mixed in pre-selected proportions with a light transmissive (transparent) binder material such as a polymer material such as for example a thermally or UV curable silicone, a thermally or UV curable epoxy material, a suitable solvent or a clear ink such as Nazdar 9700 screen ink. An example of a suitable silicone material is GE's silicone RTV615. The weight ratio loading of phosphor to polymer binder is typically in a range 35 to 95 parts per 100 with the exact loading depending on the required CCT of the emission product of the device. The phosphor/polymer is deposited over the face of the window 58 such as to form a substantially uniform thickness layer over the entire surface of the window. Depending on the binder material the phosphor/polymer layer 60 can be applied to the wafer by spin-coating, doctor blading (i.e. use of a squeegee or flexible bade), tape-casting, spraying, inkjet printing or by other deposition techniques dependent that will be apparent to those skilled in the art. The phosphor/polymer layer 60 is typically of a thickness in a range ≈10 μnm to ≈500 μm, preferably ≈10 μm to ≈100 μm. As in the case of the weight loading of the phosphor to polymer, the thickness of the phosphor/polymer layer 60 will depend on the target CCT of light generated by the device.

The light emitting device of the invention is suited for use with both inorganic or organic phosphor, an example of the former being a silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending U.S. patent application publication No. US 2007/0029526 A1 and U.S. Pat. No. 7,311,858 B2, U.S. Pat. No. 7,575,697 B2 and U.S. Pat. No. 7,601,276 B2 (all assigned to Intematix Corporation) the content of each of which is hereby incorporated by way of reference thereto.

As taught in U.S. Pat. No. 7,575,697 B2, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P) and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 B2 discloses a silicate-based yellow-green phosphor having a formula $A_2SiO_4:Eu^{2+}D$, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4:Eu^{2+}D$ in which M comprises Ca, Mg, Zn or Cd and where $0 \leq x \leq 1$ and $0 \leq y \leq 1$.

U.S. Pat. No. 7,601,276 B2 teaches a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US 2007/0029526 A1 to Cheng et al. disclose a silicate-based orange phosphor having the formula $(Sr_{1-x}M_x)_ySiO_5:Eu_z$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending U.S. patent application publication No. US 2006/0158090 A1 and U.S. Pat. No. 7,390,437 B2 (also assigned to Intematix Corporation) or an aluminum-silicate phosphor as taught in co-pending application US 2008/0111472 A1 the content of each of which is hereby incorporated by way of reference thereto.

US 2006/0158090 A1 to Wang et al. teach an aluminate-based green phosphor of formula $M_{1-x}Eu_xAl_yO_{[1+3y/2]}$ in which M is at least one of a divalent metal comprising Ba, Sr, Ca, Mg, Mn, Zn, Cu, Cd, Sm or thulium (Tm) and in which $0.1<x<0.9$ and $0.5 \leq y \leq 12$.

U.S. Pat. No. 7,390,437 B2 discloses an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3\leq y\leq 12$ and $0.8\leq z\leq 1.2$. The phosphor can be further doped with a halogen dopant H such as Cl, Br or I and be of general composition $(M_{1-x}Eu_x)_{2-z}Mg_zAl_yO_{[2+3y/2]}$:H.

US 2008/0111472 A1 to Liu et al. teach an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0\leq x\leq 0.4$; T is a trivalent metal selected from Y, lanthanum (La), Ce, praseodymium (Pr), neodymium (Nd), promethium (Pm), samarium (Sm), gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0\leq y\leq 0.4$ and z and m are in a range $0\leq z\leq 0.2$ and $0.001\leq m\leq 0.5$. The phosphor is configured such that the halogen resides on oxygen lattice sites within the silicate crystal.

The phosphor can also comprise a nitride-based red phosphor material such as is taught in our co-pending U.S. Provisional patent applications 61/054,399 filed May 19, 2008 entitled "Nitridosilicate-based red phosphors" and 61/122,569 filed Dec. 15, 2008 entitled "Nitride-based red phosphors", the content of each of which is hereby incorporated by way of reference thereto. 61/054,399 and 61/122,569 teach nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, In, Y, Se, P, As, La, Sm, antimony (Sb) or Bi; $M_b$ is a tetravalent element selected from C, Si, Ge, tin (Sn), Ni, hafnium (Hf), molybdenum (Mo), tungsten (W), Cr, Pb, Ti or zirconium (Zr); D is a halogen selected from F, Cl, Br or I; Z is an activator selected from Eu, Ce, Mn, Tb or Sm, and N is nitrogen in amounts $0.01\leq m\leq 1.5$, $0.01\leq a\leq 1.5$, $0.01\leq b\leq 1.5$, $0.0001\leq w\leq 0.6$ and $0.0001\leq z\leq 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG). The device of the present invention is particularly suited to phosphor materials whose performance is affected by the uptake of water such as for example silicate-based phosphor materials.

As described the MCPCB 52, housing 56 and window 58 together define a water (moisture) tight, preferably air/gas tight, volume (cavity) 98 in which the LED array 54 and phosphor material 60 are housed. The housing 56 is configured such that the phosphor 60 is a minimum distance of typically 0.2 mm to 1 mm from the light emitting surface of the LED chips 83. Separating the phosphor material 60 from the LED chips 83 offers a number of advantages compared with the known devices in which the phosphor material is typically provided on the surface of the LED chip, namely: a more consistent CCT and/or color hue of generated light since the phosphor material is provided over a larger surface area; and reduced thermal degradation of the phosphor material since the phosphor material is located remote to (separated from) the LED chips.

To improve the conduction of heat away from the LED chips 83 and/or improve light emission from the LED chips, it is envisaged to fill, or at least partially fill, the volume (cavity) 98 with a light transmissive material 100. For example, when the cavity 98 is air/gas tight, it can be filled with a dry gas such as nitrogen, carbon dioxide or an inert gas such as neon, argon or krypton. A benefit of filling the cavity 98 with a dry gas is that the phosphor material 60 is maintained in a dry inert atmosphere which it is envisaged, could reduce degradation of the phosphor material by preventing the uptake of water and/or oxygen.

Alternatively, the cavity 98 can be filled with a light transmissive liquid such as a mineral oil or a light transmissive gel. Advantageously, the liquid/gel is selected such that its refractive index is as close to the refractive index of the LED chips 83 and phosphor material as practicable. For example, the refractive index of an InGaN/GaN LED chip is $n\approx 2.4$ to $2.5$ whilst a high refractive index silicone has a refractive index $n\approx 1.2$ to $1.5$. Thus in practice the gel/liquid preferably has a refractive index $\geq 1.2$. The inclusion of a light transmissive gel/liquid can increase emission of light from the LED chips 83 by providing a degree of refractive index matching. It is further envisaged to fill the cavity 98 with a light transmissive solid such as a polymer material, for example a silicone or epoxy material. Again the material preferably has a refractive index $\geq 1.2$. For ease of fabrication the cavity 98 can be filled with the selected material through an opening in the housing 56 (not shown) which can then be sealed by for example soldering.

Figure 4:
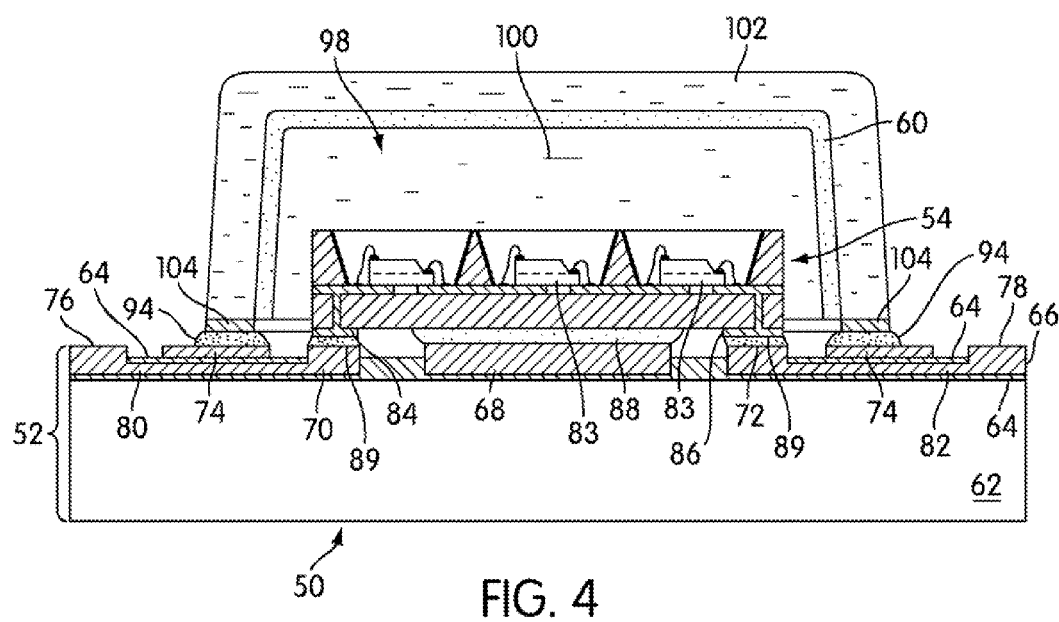
FIG. 4 is a schematic sectional representation of a light emitting device in accordance with a second embodiment of the invention.

Referring to FIG. 4 there is shown a schematic sectional representation of a light emitting device 50 in accordance with a second embodiment of the invention in which a single light transmissive cover 102 is used in place of the housing/window 56/58 assembly. The cover 102 preferably comprises a glass such as a silica glass or quartz glass or a light transmissive inorganic material such as transparent alumina ($Al_2O_3$). The phosphor material(s) 60 is/are provided as a uniform layer over the inner surface of the cover 102. A metallization layer 104, comprising for example copper (Cu), nickel (Ni) or chromium (Cr), can be provided on at least the base of the cover 102 to enable the cover 102 to be soldered 94 or otherwise attached to the mounting pad 74. An advantage of using a single glass cover member 102 is that only a single seal 94 with the substrate 52 is required.

Figure 5:
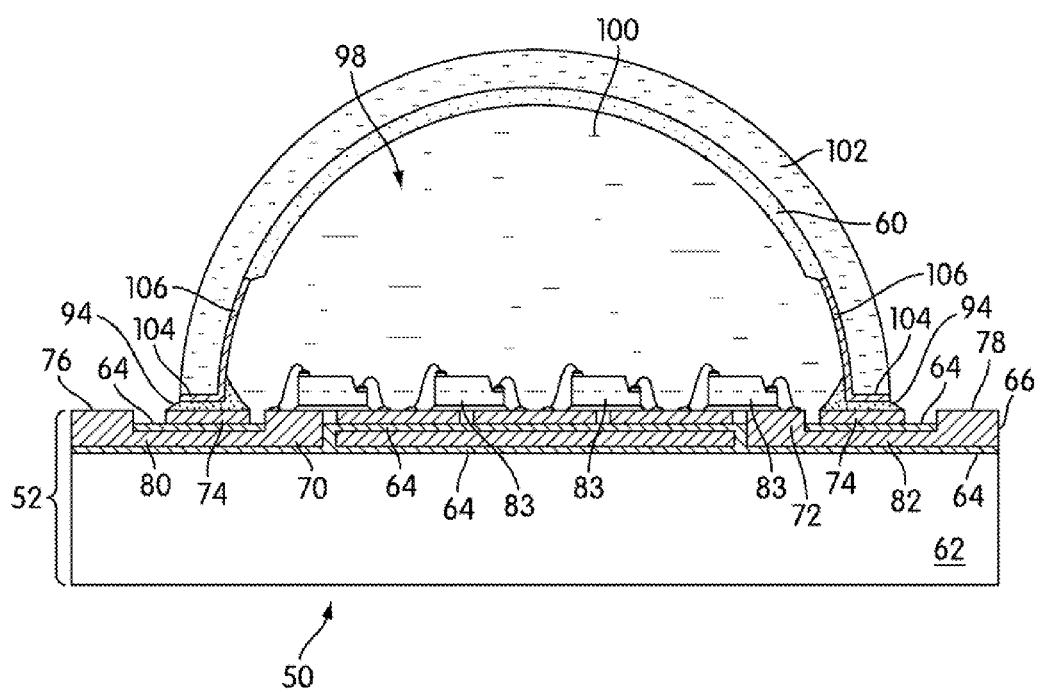
FIG. 5 is a schematic sectional representation of a light emitting device in accordance with a third embodiment of the invention.

FIG. 5 is a schematic sectional representation of a light emitting device 50 in accordance with a third embodiment of the invention. In this embodiment the glass cover member 102 comprises a substantially hemispherical (dome shaped) shell. To maximize light emission from the device 50 a metallization 106 can be provided on the interior surface of the cover member 102 that extends from the base of the cover. As shown in FIG. 5 individual LED chips 83 are mounted in direct thermal communication with the MCPCB 52 rather than a packaged array of LEDs—that is a chip-on-board (COB) arrangement.

Figure 6:
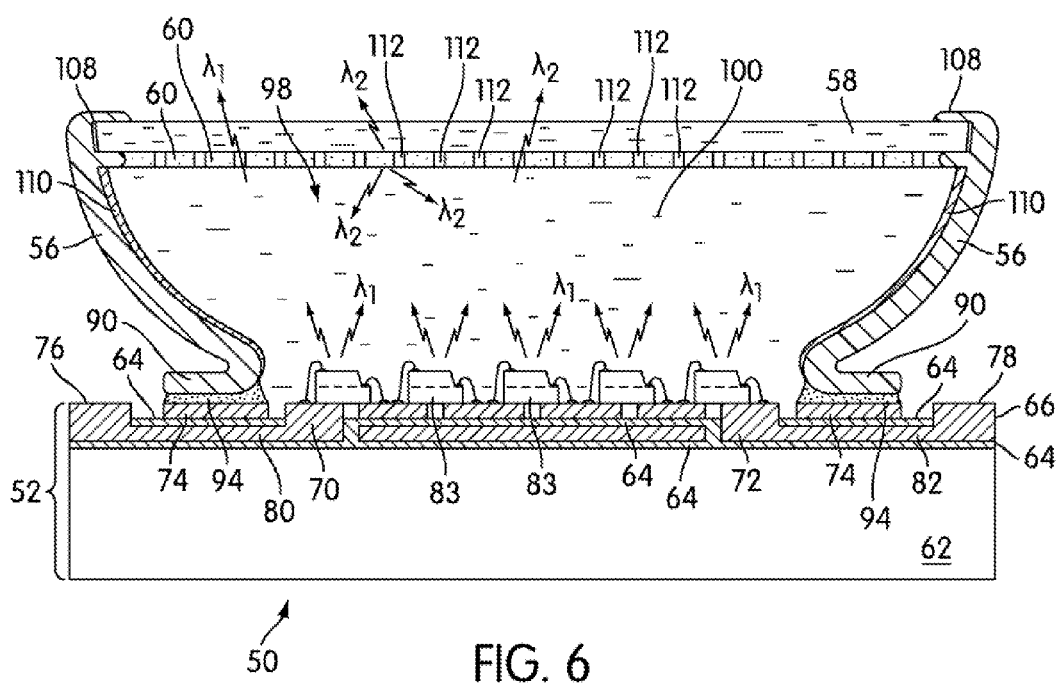
FIG. 6 is a schematic sectional representation of a light emitting device in accordance with a forth embodiment of the invention.

FIG. 6 shows a schematic sectional representation of a light emitting device 50 in accordance with a forth embodiment of the invention in which the housing 56 is configured in the form of a parabolic reflector and is generally dish-shaped in form. As in other embodiments, the housing 56 is attached to the MCPCB (substrate) 52 to form a water tight, preferably air/gas tight, seal. In the embodiment illustrated the window 58 is attached to the front opening of the housing by a compression joint 108. To assist in the dissipation of heat the housing 56 is preferably fabricated from a heat conducting material such as a metal with a low thermal expansion. The inner surface of the housing preferably includes a metallization layer 110 of a high reflectivity metal such as silver, chromium or aluminum. To increase light emission for devices in which the excitation light ($\lambda_1$) contributes to the final emission product—whether the final emission product is white or another color—the phosphor 60 can include a pattern (array) of window regions (areas) 112 with no phosphor material. The window regions 112 act as a window allowing the emission of both the excitation light and the photo luminescence generated light. Due to the isotropic nature of phosphor photo luminescence this implies that the phosphor will emit about fifty percent of its radiation in a direction back into the cavity 98. Such light will be reflected by the inner surface of the reflective housing back towards the glass window 58. Since the window regions 112 are transmissive (transparent) to both the excitation light ($\lambda_1$) and the light ($\lambda_2$) generated by the phosphor material, the window regions 112 can increase the overall emission intensity of the device 50. In order to achieve a uniform emission color and/or color temperature over the entire light emitting surface area (i.e. the window 58) of the device the window regions 112 are uniformly distributed over the light emitting surface in the form of a regular pattern such as for example a square array of circular window regions or a grid of line shaped window regions. The pattern of phosphor material is conveniently deposited on the window 58 by screen printing a mixture of the one or more phosphor materials and a suitable binder, such as Nadar's clear screen ink 9700. Alternatively, the pattern of phosphor material can be produced by other deposition methods such as ink jet printing, offset or gravure printing.

Figure 7:
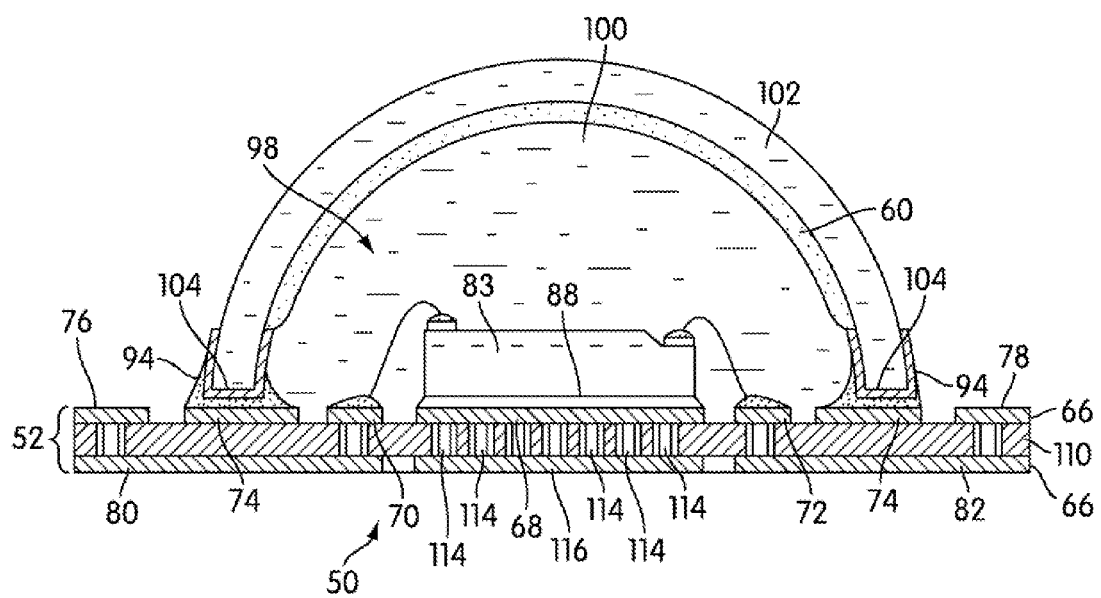
FIG. 7 is a schematic sectional representation of a light emitting device in accordance with a fifth embodiment of the invention.

FIG. 7 is a schematic sectional representation of a light emitting device 50 in accordance with a fifth embodiment of the invention. In this embodiment and as with the embodiment of FIG. 5 the glass cover member 102 is a generally hemispherical (dome shaped) shell. As shown in FIG. 7 a single one watt (i.e. ≧50 lumen output intensity) LED chip 83 is mounted in direct thermal communication with the thermally conducting substrate 52 rather than an array of LEDs. The thermally conducting substrate comprises a printed circuit board composed of an electrically insulating carrier 110 such as FR-4 (flame retardant 4) with a pattern of electrically conducting copper tracks 66. Since FR-4 is an electrical insulator and hence a poor thermal conductor a pattern of plated through vias 114 can be used to provide a thermal conduction path between the mounting pad 68 and a corresponding pad 116 on the outer (lower as illustrated) surface of the substrate 52.

Figure 8:
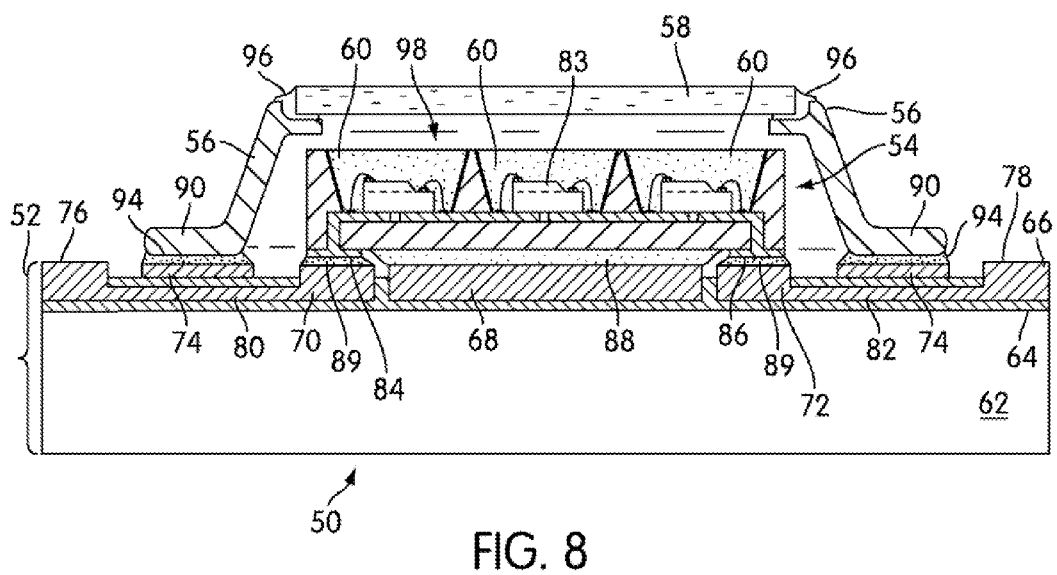
FIG. 8 is a schematic sectional representation of a light emitting device in accordance with a sixth embodiment of the invention.

Whilst it is preferred for the phosphor material to be provided remotely to (i.e. physically separated from) the LED chip(s) it is envisaged that housing the LED chips(s) and phosphor material(s) within a water tight/gas tight, hermetically sealed, enclosure can be beneficial for devices in which the phosphor material(s) is/are provided on the surface of the LED chip(s). FIG. 8 is a schematic sectional representation of a light emitting device 50 in accordance with a sixth embodiment of the invention in which the phosphor material 60 is incorporated within the packaged LED array 54. In this embodiment an array of LED chips 83 is housed in a ceramic package 54 and the phosphor material 60 is provided as an encapsulation in direct contact with the LED chips. The package 54 is mounted on an MCPCB 52. As in other embodiments, the housing 56 is attached to the substrate to form a water tight, preferably air/gas tight, seal.

It will be appreciated that the present invention is not restricted to the exemplary embodiments described and that variations can be made that are within the scope of the invention. For example, the device of the invention can be used to generate light of any color and/or color hue including arrangements in which all of the excitation light is absorbed by the phosphor material(s) and the emission product is composed of photo luminescent generated light only. Moreover to generate a desired color and/or color temperature it is envisaged to use a mixture of two or more phosphor materials.

Whilst the present invention arose in relation to devices with a high emission intensity, typically ≧50 lumens, it is equally applicable to lower power devices though the cost of a hermetically sealed package may not be justified for such devices other than in specialized applications. Furthermore the invention can be applied to the packaging of individual LED chips or a wafer containing a plurality of LED chips. Moreover, the thermally conducting substrate can comprise other forms such as for example thermally conducting ceramic substrates such as alumina ($Al_2O_3$) or low temperature co-fired ceramics.

What is claimed is:

1. A light emitting device comprising:
   a thermally conductive substrate;
   at least one light emitting diode chip mounted in thermal communication with a surface of the substrate and operable to emit excitation light having a dominant wavelength in a first wavelength range;
   a non-transmissive housing attached to the substrate and configured such that the housing and substrate together define a volume that totally encloses the at least one light emitting diode chip;
   a substantially planar window attached to the housing, wherein the substantially planar window and the housing are separate components;
   a hermetic seal formed between the substantially planar window and the housing;
   at least one phosphor material provided on an inner surface of the window within said volume, said phosphor being operable to absorb at least a part of the excitation light and to emit light having a dominant wavelength in a second wavelength range; and
   a second hermetic seal formed between the housing and the substrate;
   wherein the volume defined by the housing and the substrate that encloses the at least one light emitting diode chip is isolated from an environment by the second hermetic seal formed between the housing and the substrate and the hermetic seal formed between the substantially planar window and the housing.

2. The device of claim 1, wherein an emission product of the device comprises light of the first and second wavelength ranges and appears white in color.

3. The device of claim 1, wherein the device has an emission product of intensity selected from the group consisting of: at least 50 lumens; at least 100 lumens; at least 250 lumens; and at least 500 lumens.

4. The device of claim 1, and further comprising at least partially filling the volume with a light transmissive thermally conductive material.

5. The device of claim 4, wherein the light transmissive thermally conductive material is selected from the group consisting of:
   a gel; a mineral oil; and a thermally conductive polymer.

6. The device of claim 1, wherein the housing is attached to the substrate such that the volume is substantially gas tight.

7. The device of claim 6, and further comprising filling the volume with a gas selected from the group consisting of:
   nitrogen; neon; argon; krypton; and xenon.

8. The device of claim 1, wherein the housing is attached to the substrate by a method selected from the group consisting of:
   soldering; brazing; adhesive; and a metal loaded epoxy.

9. The device according to claim 1, wherein the window is attached to the housing by a method selected from the group consisting of: soldering; an adhesive; and a compression seal.

10. The device of claim 9, wherein the window is selected from the group consisting of: a glass; a silica glass; a quartz glass, transparent alumina, a polymer material; a polycarbonate; and an acrylic.

11. The device of claim 10, wherein the housing comprises a thermally conductive material selected from the group consisting of:
a metal; an invar alloy, aluminum; copper; a thermally conductive polymer; and a thermally conductive ceramic.

12. The device of claim 1, wherein the housing comprises a substantially parabolic reflector.

13. The device of claim 1, wherein the substrate is selected from the group consisting of a printed circuit board; a metal core printed circuit board; a ceramic circuit board, a thermally conducting ceramic; a low temperature co-fired ceramic; and alumina 14. The device of claim 1, wherein a minimum distance from the light emitting surface of the at least one light emitting diode to the at least one phosphor material is in a range 0.2mm to 1mm.

15. The device of claim 1, wherein the phosphor material is a silicate-based material.

16. A white light emitting device comprising:
a) a thermally conductive substrate;
b) a plurality of light emitting diode chips mounted in thermal communication with a surface of the substrate and operable to emit excitation light having a dominant wavelength in a first wavelength range;
c) a non-transmissive housing attached to the substrate and configured such that the housing and substrate together define a volume that totally encloses the plurality of light emitting diode chips;
d) a substantially planar window attached to the housing such that a water tight seal is formed, wherein the substantially planar window and the housing are separate components;
e) a hermetic seal formed between the substantially planar window and the housing;
f) at least one phosphor material provided on an inner surface of the window within said volume, said phosphor being operable to absorb at least a part of the excitation light and to emit light having a dominant wavelength in a second wavelength range, wherein an emission product of the device comprises light of the first and second wavelength ranges and appears white in color; and
g) a second hermetic seal formed between the housing and the substrate;
wherein the volume defined by the housing and the substrate that encloses the at least one light emitting diode chip is isolated from an environment by the second hermetic seal formed between the housing and the substrate and the hermetic seal formed between the substantially planar window and the housing.

17. The device according to claim 16, wherein the emission product has an intensity selected from the group consisting of: at least 100 lumens; at least 250 lumens; and at least 500 lumens.

18. A light emitting device comprising:
a) a thermally conductive substrate;
b) at least one light emitting diode chip incorporating a phosphor material mounted in thermal communication with a surface of the substrate; and
c) a non-transmissive housing attached to the substrate and configured such that the housing and substrate together define a volume that totally encloses the at least one light emitting diode chip;
d) a substantially planar window attached to the housing, wherein the substantially planar window and the housing are separate components;
e) a hermetic seal formed between the substantially planar window and the housing; and
f) a second hermetic seal formed between the housing and the substrate;
wherein the volume defined by the housing and the substrate that encloses the at least one light emitting diode chip is isolated from an environment by the second hermetic seal formed between the housing and the substrate and the hermetic seal formed between the substantially planar window and the housing.

* * * * *